(12) United States Patent
Huang et al.

(10) Patent No.: US 10,840,176 B2
(45) Date of Patent: Nov. 17, 2020

(54) CONDUCTIVE STRUCTURE, CIRCUIT, AND DISPLAY DEVICE

(71) Applicant: E Ink Holdings Inc., Hsinchu (TW)

(72) Inventors: Guan-Ru Huang, Hsinchu (TW); Wen-Yu Kuo, Hsinchu (TW); Ya-Tang Chuang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/548,828

(22) Filed: Aug. 22, 2019

(65) Prior Publication Data
US 2020/0098680 A1 Mar. 26, 2020

(30) Foreign Application Priority Data

Sep. 21, 2018 (TW) .............................. 107133474 A

(51) Int. Cl.
*H05K 1/11* (2006.01)
*H01L 23/498* (2006.01)

(52) U.S. Cl.
CPC .............................. *H01L 23/49838* (2013.01)

(58) Field of Classification Search
CPC .......................... H05K 1/115; H01L 23/49838
USPC ........................................................ 174/262
See application file for complete search history.

(56) References Cited

U.S. PATENT DOCUMENTS

| | | | |
|---|---|---|---|
| 6,580,035 B1 | 6/2003 | Chung | |
| 7,755,201 B2 | 7/2010 | Kim | |
| 8,173,498 B2 | 5/2012 | Lin et al. | |
| 8,304,782 B2 | 11/2012 | Lin | |
| 8,647,973 B2 | 2/2014 | Kim | |
| 2001/0010573 A1* | 8/2001 | Ohta | G02F 1/134363 349/139 |
| 2008/0179085 A1* | 7/2008 | Choi | H05K 1/0219 174/261 |
| 2017/0150598 A1* | 5/2017 | Jung | G06F 3/041 |
| 2019/0008041 A1* | 1/2019 | Nakamura | G06F 3/044 |

FOREIGN PATENT DOCUMENTS

| | | |
|---|---|---|
| CN | 104966709 A | 10/2015 |
| TW | 201618621 A1 | 5/2016 |

OTHER PUBLICATIONS

Corresponding Taiwan office action dated Nov. 28, 2019.

* cited by examiner

*Primary Examiner* — Hoa C Nguyen
(74) *Attorney, Agent, or Firm* — CKC & Partners Co., LLC

(57) ABSTRACT

A conductive structure includes a first wire, a second wire, and a conductive pillar. The second wire is disposed over the first wire and intersected with the first wire. The conductive pillar is disposed between the first wire and the second wire. A bottom surface area of the conductive pillar is greater than an area at which the first wire overlaps the conductive pillar.

10 Claims, 6 Drawing Sheets

CONDUCTIVE STRUCTURE, CIRCUIT, AND DISPLAY DEVICE

CROSS-REFERENCE TO RELATED APPLICATION

This application claims priority to Taiwan Application Serial Number 107133474, filed Sep. 21, 2018, which is herein incorporated by reference.

BACKGROUND

Field of Invention

The present disclosure relates to a conductive structure, a circuit, and a display device.

Description of Related Art

With the development of display technology, the display panel has been widely used in various display devices, such as televisions, laptops, tablets, e-paper displays, and mobile phones. Among the various factors that affect a consumer's decision to choose a particular display device, the display performance of the display panel thereof will greatly influence the consumer's willingness to buy the display device.

Parasitic capacitance is a capacitance formed as a result of the metal on a signal transmission path being unequal potential when a signal is transmitted in a circuit. Therefore, when calculating parasitic capacitance, a contact pad at an intersection of two wires without electrical connection will be counted in the parasitic capacitance. The display performance of a display device is easily impacted when the parasitic capacitance is too large.

SUMMARY

Accordingly, the present disclosure provides a conductive structure which can effectively improve the issue of parasitic capacitance. The conductive structure of the present disclosure includes a first wire, a second wire, a conductive pillar, and an insulating layer. The second wire is disposed over the first wire and intersected with the first wire. The conductive pillar is disposed between the first wire and the second wire. A bottom surface area of the conductive pillar is greater than an area at which the first wire overlaps the conductive pillar. The insulating layer is between the first wire and the second wire, and surrounds the conductive pillar.

In an embodiment of the present disclosure, a top surface area of the conductive pillar is greater than an area at which the second wire overlaps the conductive pillar.

In an embodiment of the present disclosure, the second wire includes a main body and a protruding part, and the protruding part extends from both sides of the main body.

In an embodiment of the present disclosure, the protruding part of the second wire has a width in a direction that the main body is extended, and the width of the protruding part is substantially equal to a width of the first wire in the direction.

The present disclosure provides a circuit design, which includes a plurality of first wires, a plurality of second wires, at least one conductive pillar, and an insulating layer. The second wires are intersected with the first wires to form a plurality of first intersections and a plurality of second intersections. The second wires are electrically connected to the first wires at the first intersections. The second wires are electrically insulated from the first wires at the second intersections. The conductive pillar is disposed at one of the first intersections, and is between the corresponding first wire and the corresponding second wire. A bottom surface area of the conductive pillar is greater than an area at which the first wire overlaps the conductive pillar. The insulating layer is disposed between the first wires and the second wires, and surrounds the conductive pillar. The insulating layer is disposed at the second intersections, and electrically insulates the first wires from the second wires.

In an embodiment of the present disclosure, a top surface area of the conductive pillar is greater than an area at which the second wire overlaps the conductive pillar.

In an embodiment of the present disclosure, the circuit design further comprises at least one semiconductor layer disposed between the insulating layer and one of the second wires. A top surface area of the semiconductor layer is substantially equal to a top surface area of the conductive pillar.

In an embodiment of the present disclosure, each of the second wires includes a main body and a protruding part. Each of the protruding parts extends from both sides of the main body.

In an embodiment of the present disclosure, the protruding part of each of the second wires has a width in a direction that the main body is extended, and the width of each of the protruding parts is substantially equal to a width of the each of the first wires in the direction.

The present disclosure provides a display device, which includes a substrate, a plurality of first wires, a plurality of second wires, a plurality of conductive pillars, and an insulating layer. The first wires are disposed on the substrate. The second wires are disposed on the first wires and intersected with the first wires to form a plurality of first intersections. The second wires are electrically connected to the first wires at the first intersections. The conductive pillars are disposed between the first wires and the second wires, and are disposed at the first intersections to electrically connect to the first wires and the second wires. An area at which each of the conductive pillars orthogonally projects on the substrate is greater than an area of overlap between the orthogonal projection of the conductive pillar on the substrate and an orthogonal projection of the corresponding first wire on the substrate. The insulating layer is disposed between the first wires and the second wires, and surrounds the conductive pillars.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description.

In the following description, numerous specific details will be described in detail to enable readers to fully understand the following embodiments. However, the embodiments of the present disclosure may be practiced without these specific details. In other cases, for simplifying the drawings, some of the conventional structures and elements are shown with schematic illustrations.

Figure 1:
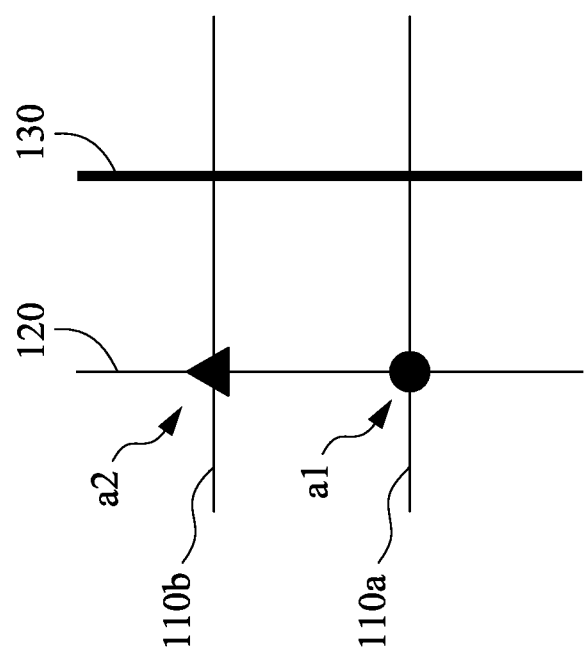
FIG. 1 is a partial diagram of a circuit design of a pixel array substrate according to one comparative example of the present disclosure.

FIG. 1 is a partial diagram of a circuit of a pixel array substrate according to one example of the present disclosure. As shown in FIG. 1, two first signal lines 110a and 110b are intersected with a second signal line 130, and are intersected with a selection line 120 to form a first intersection a1 and a second intersection a2. The first signal line 110a is electrically connected to the selection line 120 at the first intersection a1, such that a signal from an external signal source can be transmitted to the first signal line 110a by the selection line 120. The first signal line 110b is electrically insulated from the selection line 120 at the second intersection a2. However, the first signal line 110b can be connected to the external signal source by another selection line (not shown). Typically, a contact pad is disposed for use as a connection at an intersection where a signal line is electrically connected to a selection line (e.g., the first intersection a1), in which the contact pad is larger than the width of the lines and an area of a conductive hole. However, an optical inspection is often performed in the manufacturing process to check whether the line structure at each intersection is consistent. Accordingly, a contact pad is also disposed at an intersection where a signal line does not need to be electrically connected to a selection line (e.g., the second intersection a2).

Figure 2:
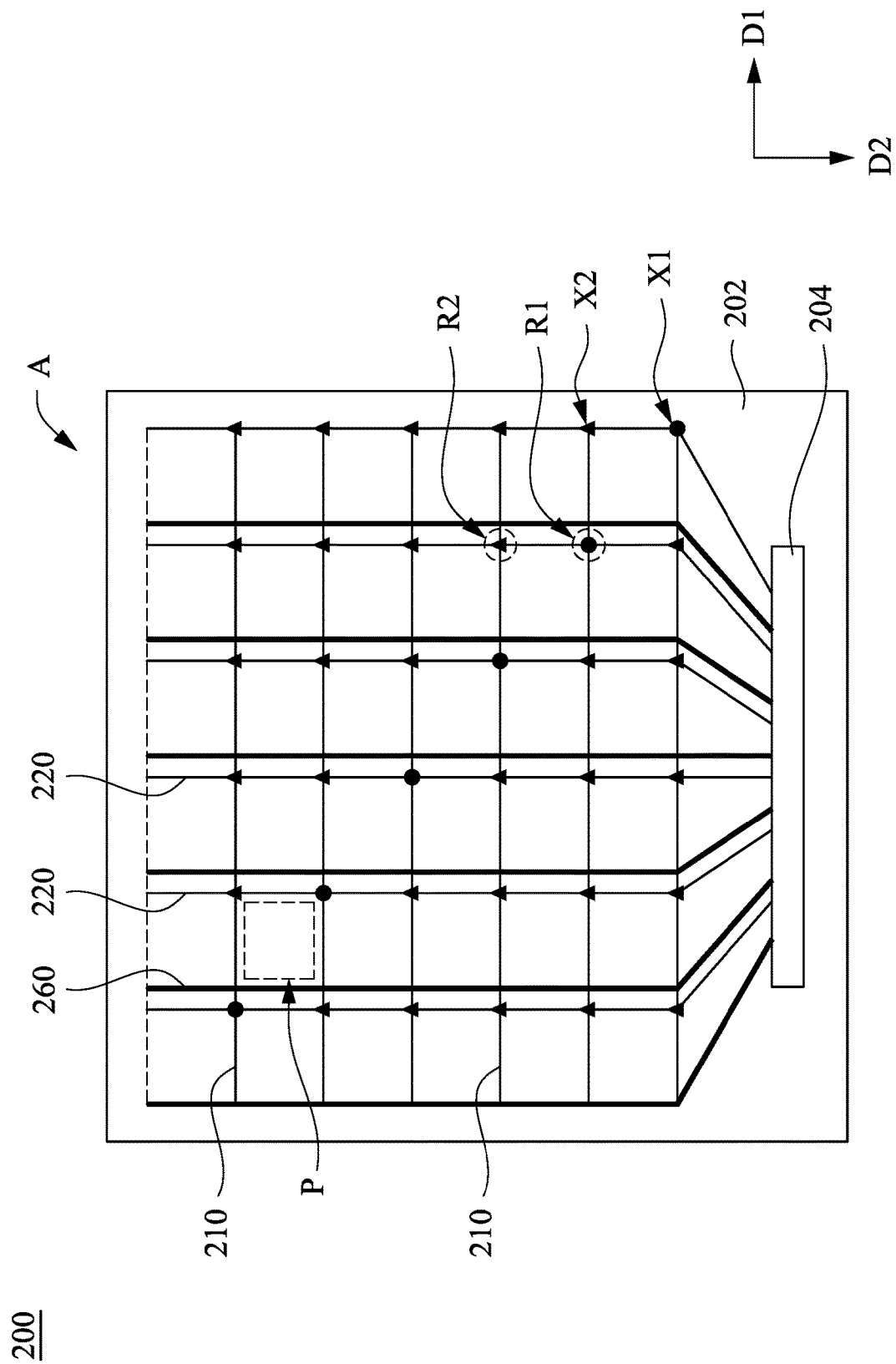
FIG. 2 is a top view of a circuit of a pixel array substrate according to one embodiment of the present disclosure.

FIG. 2 is a top view of a circuit A of a pixel array substrate 200 according to one embodiment of the present disclosure. As shown in FIG. 2, the circuit A of the pixel array substrate 200 includes a plurality of first wires 210 and a plurality of second wires 220. Specifically, the first wires 210 and the second wires 220 are intersected with each other to form a plurality of conductive structures R1 and a plurality of insulating structures R2. The conductive structures R1 are at first intersections X1, and the insulating structures R2 are at second intersections X2. The first wires 210 are electrically connected to the second wires 220 at the first intersections X1, and the first wires 210 are electrically insulated from the second wires 220 at the second intersections X2. FIG. 2 is briefly described above, and a detailed description of the embodiments will be provided below.

Figure 3:
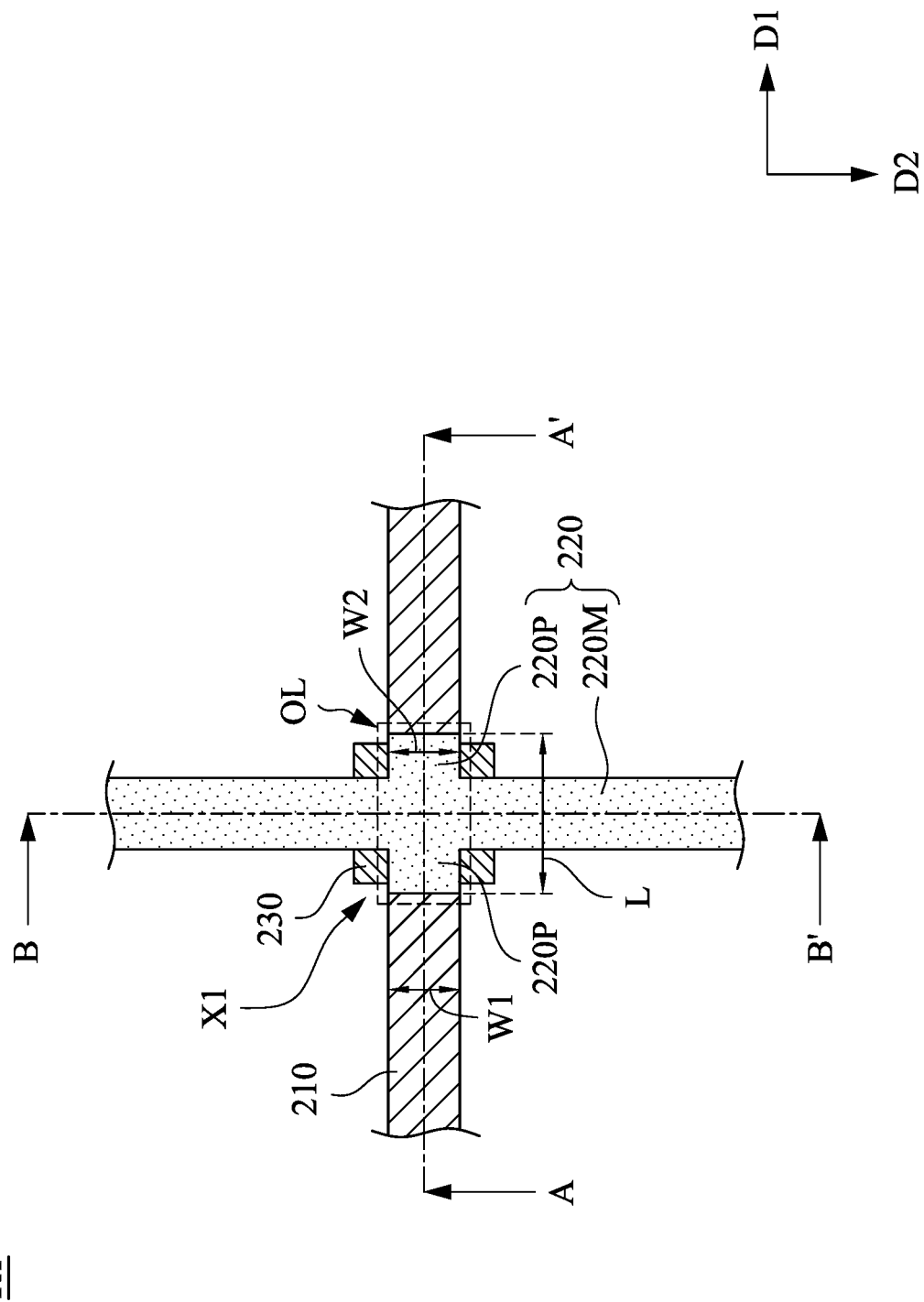
FIG. 3 is an enlarged diagram of a conductive structure in FIG. 2.

FIG. 3 is an enlarged diagram of one of the conductive structures R1 in FIG. 2. As shown in FIG. 3, the first wire 210 extends along a direction D1, and the second wire 220 extends along a direction D2, such that the first wire 210 is intersected with the second wire 220. In one embodiment, the direction D1 is substantially perpendicular to the direction D2, but the present disclosure is not limited thereto. In some embodiments, the second wire 220 includes a main body 220M and a protruding part 220P. Specifically, the main body 220M extends along the direction D2, and the protruding part 220P extends a certain distance from both sides of the main body 220M along the direction D1. The intersection X1 of the first wire 210 and the second wire 220 further includes a conductive pillar 230 for electrically interconnecting the first wire 210 and the second wire 220. This design makes the intersection X1 to be a conductive structure R1 for electrically connecting the first wire 210 and the second wire 220. The aforementioned protruding part 220P is not a necessary feature of the present disclosure, and may be omitted.

Figure 4:
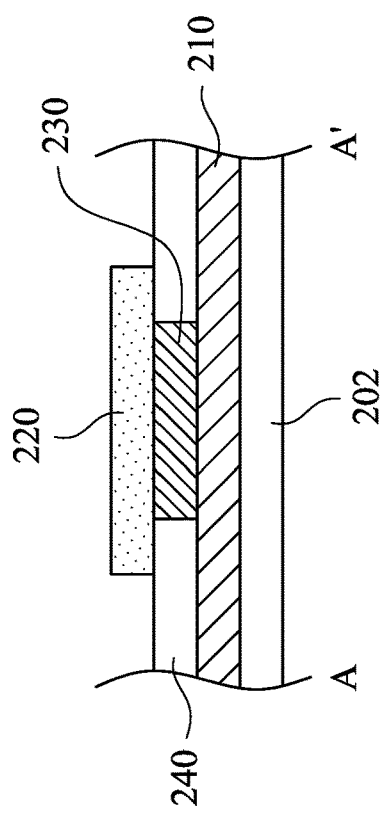
FIG. 4A is a cross sectional diagram along the line A-A' of FIG. 3.
FIG. 4B is a cross sectional diagram along the line B-B' of FIG. 3.

FIG. 4A is a cross sectional diagram along the line A-A' of FIG. 3. FIG. 4B is a cross sectional diagram along the line B-B' of FIG. 3. As shown in FIG. 4A and FIG. 4B, specifically, the second wire 220 is disposed on the first wire 210. In various embodiments, the first wire 210 and the second wire 220 are generally formed by metal materials, such as titanium, tantalum, silver, gold, platinum, copper, aluminum, molybdenum, niobium, tungsten, chromium, rhodium, rhenium, ruthenium, cobalt, other suitable metal, or an alloy of thereof, but the present disclosure is not limited thereto. In other embodiments, the first wire 210 and the second wire 220 may also be formed by other conductive materials, such as an oxide of metal material, a nitride of metal material, an oxynitride of metal material, or a stacked layer of metal material and other conductive material. Specifically, when forming (e.g., etching) the second wire 220 positioned at the top, in order to prevent a portion of the first wire 210 neighboring a bottom of the second wire 220 from being etched by the chemical, two wing sections of the second wire 220 (i.e., the protruding part 220P of the second wire 220) at the intersection where the two wires 210 and 220 intersect are designed to protect the first wire 210. As shown in FIG. 3, the protruding part 220P of the second wire 220 has a width W2 along the direction that the main body 220M extends (i.e., the direction D2), and the width W2 of the protruding part 220P is substantially equal to a width W1 of the first wire 210.

With continued reference to FIG. 4A and FIG. 4B, the conductive pillar 230 is disposed between the first wire 210 and the second wire 220, and is electrically connected to the first wire 210 and the second wire 220. In various embodiments, the conductive pillar 230 is generally formed by metal materials, such as titanium, tantalum, silver, gold, platinum, copper, aluminum, molybdenum, niobium, tungsten, chromium, rhodium, rhenium, ruthenium, cobalt, other suitable metal, or an alloy of thereof, but the present disclosure is not limited thereto. In other embodiments, the conductive pillar 230 may also be formed by other conductive materials, such as an oxide of metal material, a nitride of metal material, an oxynitride of metal material, or a stacked layer of metal material and other conductive material. In some embodiments, the conductive pillar 230 may be in the shape of a cylinder or a prism, or may be another geometric pillar. Accordingly, it is understood that a top surface area of the conductive pillar 230 is substantially equal to its bottom surface area. In other embodiments, according to the manufacturing process of the conductive pillar 230, the conductive pillar 230 may also be in the shape of a trapezoidal pillar (not shown), in which, for example, a top surface area of the conductive pillar 230 may be greater than its bottom surface area.

Referring back to FIG. 3, the bottom surface area of the conductive pillar 230 is greater than an area at which the first wire 210 overlaps the conductive pillar 230. Moreover, the bottom surface area of the conductive pillar 230 is greater than an area at which the second wire 220 orthogonally projects onto the first wire 210. In some embodiments, the top surface area of the conductive pillar 230 is greater than an area at which the second wire 220 overlaps the conductive pillar 230. In this design, the area at the first intersection X1 that affects the parasitic capacitance is the overlapping area (L×W1 or L×W2) of the first wire 210 and the second wire 220. Compared with the conventional conductive structure having a design of a contact pad with a large area, the conductive structure of the present disclosure can reduce the parasitic capacitance by about 10% to about 25%, such that the problem of parasitic oscillation can be avoided when the conductive structure is applied to a display device. Parasitic capacitance is also called stray capacitance.

With reference to FIG. 4A and FIG. 4B, in various embodiments, the conductive structure R1 further includes an insulating layer 240. Specifically, the insulating layer 240 is disposed between the first wire 210 and the second wire 220, and surrounds the conductive pillar 230. That is, the conductive pillar 230 is positioned in the insulating layer 240, and is electrically connected to the first wire 210 and the second wire 220. In various embodiments, the material of the insulating layer 240 may be any suitable insulating material including, but not limited to, silicon oxide, silicon nitride, silicon oxynitride, silicon oxycarbide, silicon carbide, or a combination thereof. The aforementioned insulating materials form the stray capacitance which is between the first wire 210 and the second wire 220. In some embodiments, the conductive structure R1 may further include a substrate 202 under the first wire 210. In various examples, the substrate 202 may be a transparent substrate, an opaque substrate, or a flexible substrate. For example, the transparent substrate includes glass, quartz, or other transparent materials. The opaque substrate includes ceramic, wafer, or other opaque materials. The flexible substrate includes plastic, rubber, polyester, polycarbonate, or other flexible materials.

Reference is made back to FIG. 2. Another aspect of the present disclosure is to provide a circuit A, which includes a plurality of first wires 210 and a plurality of second wires 220. As shown in FIG. 2, the first wires 210 are intersected with the second wires 220 to form a plurality of first intersections X1 and a plurality of second intersections X2. The second wires 220 are electrically connected to the first wires 210 at the first intersections X1 by the conductive pillars 230 (shown in FIG. 3 and FIG. 4A) to form conductive structures R1, and the second wires 220 are electrically insulated from the first wires 210 at the second intersections X2 to form insulating structures R2.

In one embodiment, the first wires 210 extend along direction D1 and are arranged in rows that are separated along direction D2, and the second wires 220 extend along the direction D2 and are arranged in columns that are separated along direction D1. In one embodiment, the direction D1 is substantially perpendicular to the direction D2, but the present disclosure is not limited thereto.

Referring to FIG. 3, FIG. 4A and FIG. 4B, the conductive pillar 230 is disposed at the first intersection X1, and is between the first wire 210 and the second wire 220, wherein the bottom surface area of the conductive pillar 230 is greater than an area at which the first wire 210 overlaps the conductive pillar 230. The bottom surface area of the conductive pillar 230 is also greater than an area at which the second wire 220 orthogonally projects onto the first wire 210. In some embodiments, the top surface area of the conductive pillar 230 is greater than an area at which the second wire 220 overlaps the conductive pillar 230. This design makes the area that affects the parasitic capacitance between the first wire 210 and the second wire 220 at the first intersection X1 to be L×W1 (or L×W2).

Figure 5:
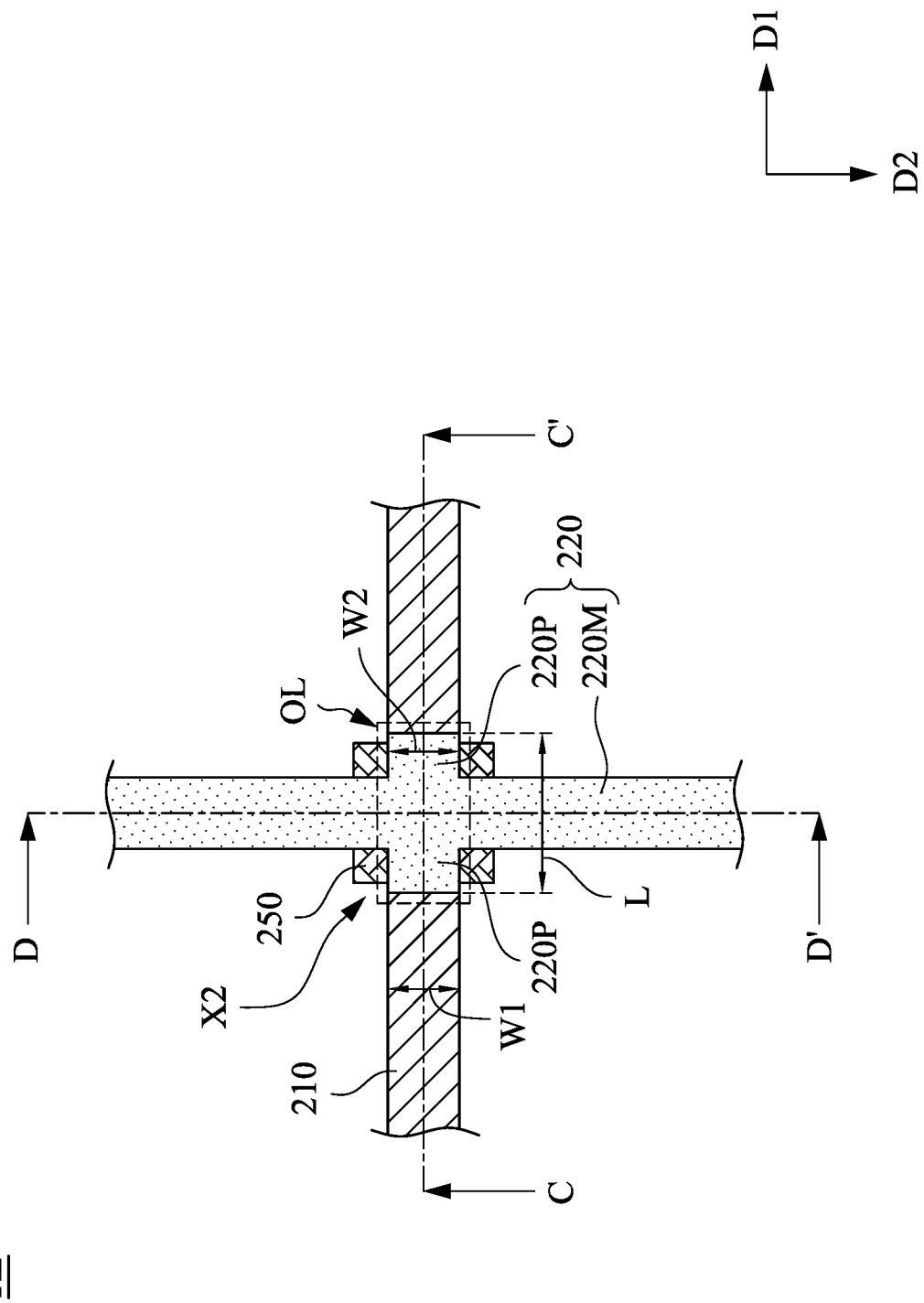
FIG. 5 is an enlarged diagram of an insulating structure in FIG. 2.

FIG. 5 is a partial enlarged diagram of the insulating structure R2 in FIG. 2. As shown in FIG. 5, the first wire 210 is electrically insulated from the second wire 220 at each of the second intersections X2 described above. That is, the first wire 210 is not electrically connected to the second wire 220 at the second intersection X2. Accordingly, the second intersection X2 does not include the conductive pillar 230 for electrically connecting the first wire 210 and the second wire 220 at the first intersections X1. It is understood that with respect to the structural features and the materials of the first wire 210 and the second wire 220, reference can be made to the above description related to FIGS. 3-4B, and the description will not be repeated.

Figure 6A:
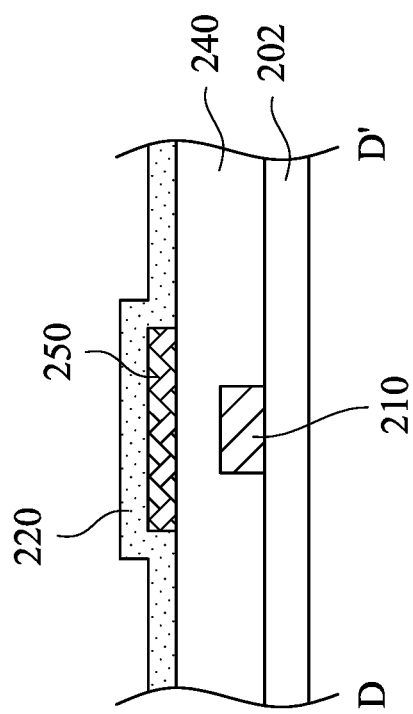
FIG. 6A is a cross sectional diagram along the line C-C' of FIG. 5.
Figure 6B:
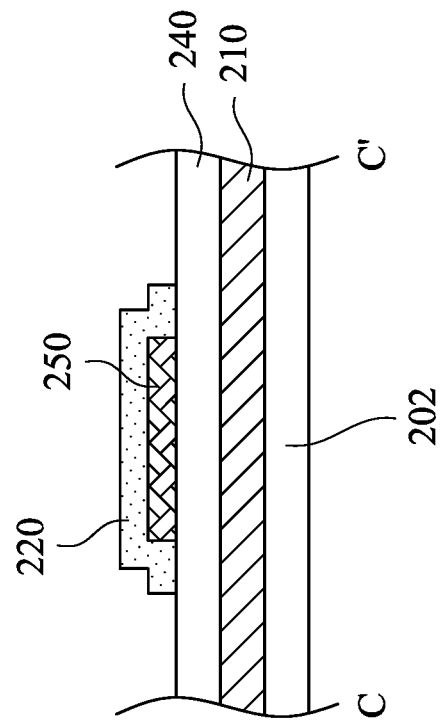
FIG. 6B is a cross sectional diagram along the line D-D' of FIG. 5.

FIG. 6A is a cross sectional diagram along the line C-C' of FIG. 5. FIG. 6B is a cross sectional diagram along the line D-D' of FIG. 5. As shown in FIG. 6A and FIG. 6B, in various embodiments, in the insulating structure R2, the circuit A also includes an insulating layer 240 disposed between the first wire 210 and the second wire 220. It is understood that the first wires 210 are electrically insulated from the second wires 220 at the second intersections X2 by the insulating layer 240. In one embodiment, the insulating layer 240 at the second intersection X2 and the insulating layer 240 at the first intersection X1 are formed by the same manufacturing process. Accordingly, it is understood that the material of the insulating layer 240 at the second intersection X2 is substantially the same as the material of the insulating layer 240 at the first intersection X1.

With continued reference to FIG. 6A and FIG. 6B, in the insulating structure R2, the circuit A further includes a semiconductor layer 250 disposed between the insulating layer 240 and the second wire 220, but this disclosure is not limited thereto. The semiconductor layer 250 may be substituted by a metal layer or a layer of another material, which may be placed on the insulating layer 240 in accordance with the order of the manufacturing process, so that the final product can pass the automated optical inspection. In various examples, the semiconductor layer 250 includes amorphous silicon, polysilicon, microcrystalline silicon (mc-Si), single crystal silicon, a combination of thereof, or other semiconductor materials.

Typically, in the process of manufacturing a circuit layout, automated optical inspection (AOI) is performed to detect the circuit layout from above to ascertain whether the wiring structures neighboring each intersection are consistent. If the wiring structures are inconsistent, it will be determined to be defective, such that the subsequent processes cannot be performed. In the electrically insulating second intersection X2 shown in FIG. 6A and FIG. 6B, the first wire 210 and the second wire 220 are still electrically insulated from each other when the insulating structure R2 does not include the semiconductor layer 250. However, when performing the automated optical inspection, the second intersection X2 does not have a structure similar to the conductive pillar 230 (shown in FIGS. 4A and 4B), such that the wiring structure at the second intersection X2 is determined to be defective. Therefore, the semiconductor layer 250 similar to the conductive pillar 230 (shown in FIGS. 4A and 4B) must be disposes at the second intersection X2, so that the wiring structures neighboring each intersection are similar to thereby satisfy inspection standards of the automated optical inspection. For example, the wiring structure neighboring the first intersection X1 and the wiring structure neighboring the second intersection X2 are determined to be similar when machine vision is utilized because the semiconductor layer 250 is disposed at the second intersection X2 and between the insulating layer 240 and the second wire 220. Furthermore, the semiconductor layers 250 are electrically insulated from the first wires 210 and the second wires 220. The aforementioned structure (i.e., the structure of the second intersection X2) is designed so that a determination utilizing optical inspection can be positive, and hence, the aforementioned structure is not necessary for a panel if optical inspection results are not of concern.

Accordingly, in order to make the wiring structure neighboring each intersection consistent, the shape of the semiconductor layer 250 shown in top view (as shown in FIG. 3) should be the same as or similar to the shape of the conductive pillar 230 shown in top view (as shown in FIG. 5). In one embodiment, a top surface area of the semiconductor layer 250 is substantially equal to a top surface area of the conductive pillar 230.

As shown in FIG. 5, this design makes the parasitic capacitance area between the first wire 210 and the second wire 220 in the second intersection X2 also L×W1 (or L×W2). Compared with the conventional conductive structure having a circuit in which a contact pad has a large area, the circuit A of the present disclosure can reduce the parasitic capacitance by about 10% to about 25%, such that the problem of parasitic oscillation can be avoided when the conductive structure is applied to a display device.

The conductive structure R1 and the circuit A of the present disclosure can be applied to the pixel array substrate of various display devices. For example, the pixel array substrate 200 shown in FIG. 2 includes the circuit A of the present disclosure, and the circuit A includes the aforementioned conductive structure R1.

As shown in FIG. 2, the pixel array substrate 200 includes a substrate 202, a driving unit 204 and a circuit A. The circuit A and the driving unit 204 are on the substrate 202. The circuit A includes a plurality of first wires 210 which intersect with a plurality of second wires 220 to form a plurality of first intersections X1 and a plurality of second intersections X2. More specifically, the second wires 220 are electrically connected to the first wires 210 at the first intersections X1 to form conductive structures R1. The second wires 220 are electrically insulated from the first wires 210 at the second intersections X2 to form insulating structures R2. In various embodiments, the first wires 210 extend along direction D1 and are arranged in rows that are separated along direction D2, and the second wires 220 extend along the direction D2 and are arranged in columns that are separated along the direction D1. In one example, the direction D1 is substantially perpendicular to the direction D2, but the present disclosure is not limited thereto. It should be noted that the second wires 220 further extend to electrically connect to the driving unit 204, and transmit signals from the driving unit 204. The first wires 210 electrically connect to the second wires 220 by the first intersections X1, and receive the signal of the driving unit 204 by the second wires 220 electrically connected to the driving unit 204.

In various examples, the circuit A further includes a plurality of scan lines 260, which are parallel to the second wires 220. More specifically, the first wires 210 may be data lines, and the second wires 220 may be selection lines. It should be noted that the second wires 220 and the scan lines 260 intersect with the first wires 210 to define a plurality of pixel regions P. For example, each pixel region P includes at least one active element (not shown) and at least one pixel electrode (not shown). The active element electrically connects one of the first wires 210 and one of the scan lines 260. It should be noted that the first wires 210 intersect with and are electrically insulated from the scan lines 260. The second wires 220 are parallel to and are electrically insulated from the scan lines 260. It should be noted that the scan lines 260 and the second wires 220 substantially extend to the driving unit 204. Accordingly, compared with the conventional structural design, the pixel array substrate 200 of the present disclosure shown in FIG. 2 can reduce the width of the frame and thereby achieve a design of narrow frame. The conventional structural design does not include selection lines (i.e., the second wire 220 of the present disclosure), such that the data lines (i.e., the first wires 210 of the present disclosure) must be pulled from both sides of the pixel array to the driving unit. Furthermore, in another embodiment of the present disclosure, the components with reference number 260 shown in FIG. 2 may be designed as data lines and are parallel to the second wire 220, and the scan lines are the components with the reference number 210.

Referring to FIGS. 2, 3, 4A, and 4B, yet another aspect of the present disclosure is to provide a display device. The display device includes a substrate 202, a plurality of first wires 210, a plurality of second wires 220, a plurality of conductive pillars 230, and an insulating layer 240. Specifically, the plurality of first wires 210 are disposed on the substrate 202. The plurality of second wires 220 are on the first wires 210, and intersect with the first wires 210 to form a plurality of first intersections X1. The second wires 220 are electrically connected to the first wires 210 at the first intersections X1. The plurality of conductive pillars 230 are disposed at the first intersections X1, and between the first wires 210 and the second wires 220. Each conductive pillar 230 electrically connects the corresponding first wire 210 and the corresponding second wire 220. It should be noted that an area at which each of the conductive pillars 230 orthogonally projects on the substrate 202 is greater than an area of overlap between the orthogonal projection of the conductive pillar 230 on the substrate 202 and an orthogonal projection of the corresponding first wire 210 on the substrate 202. The insulating layer 240 is disposed between the first wires 210 and the second wires 220, and surrounds the conductive pillars 230.

As described above, the conductive structure, and the first wires and the second wires in the circuit do not be required having a large area in a contact pad as described in the related art. The consistency of the width and area of original wire could be maintained in the present disclosure for reducing the parasitic capacitance between the wires.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A conductive structure, comprising:
   a first wire on a substrate;
   a second wire disposed on the first wire, and intersected with the first wire, wherein the second wire directly connects to a driving unit and transmits signals from the driving unit;
   a conductive pillar disposed between the first wire and the second wire, wherein a bottom surface area of the conductive pillar is greater than an area at which the first wire overlaps the conductive pillar; and
   an insulating layer disposed between the first wire and the second wire, and surrounding the conductive pillar.

2. The conductive structure of claim 1, wherein a top surface area of the conductive pillar is greater than an area at which the second wire overlaps the conductive pillar.

3. The conductive structure of claim 1, wherein the second wire includes a main body and a protruding part, and the protruding part extends from both sides of the main body.

4. The conductive structure of claim 3, wherein the protruding part of the second wire has a width in a direction that the main body is extended, and the width of the protruding part is substantially equal to a width of the first wire in the direction.

5. A circuit, comprising:
   a plurality of first wires on a substrate;
   a plurality of second wires on the first wires, and intersected with the first wires to form a plurality of first intersections and a plurality of second intersections, wherein the second wires are electrically connected to the first wires at the first intersections, and the second wires are electrically insulated from the first wires at the second intersections, wherein the second wires directly connect to a driving unit and transmit signals from the driving unit;
   at least one conductive pillar disposed at one of the first intersections, and between the corresponding first wire and the corresponding second wire, wherein a bottom surface area of the conductive pillar is greater than an area at which the second wire orthogonally projects on the first wire; and
   an insulating layer disposed between the first wires and the second wires, and surrounding the conductive pillar, wherein the insulating layer is disposed at the second intersections, and electrically insulates the first wires from the second wires.

6. The circuit of claim 5, wherein a top surface area of the conductive pillar is greater than an area at which the second wire overlaps the conductive pillar.

7. The circuit of claim 5, further comprising at least one semiconductor layer disposed between the insulating layer and one of the second wires, wherein a top surface area of the semiconductor layer is substantially equal to a top surface area of the conductive pillar.

8. The circuit of claim 5, wherein each of the second wires includes a main body and a protruding part, and each of the protruding parts extends from both sides of the main body.

9. The circuit of claim 8, wherein the protruding part of each of the second wires has a width in a direction that the main body is extended, and the width of each of the protruding parts is substantially equal to a width of the each of the first wires in the direction.

10. A display device, comprising:
    a substrate;
    a plurality of first wires disposed on the substrate;
    a plurality of second wires disposed on the first wires, and intersected with the first wires to form a plurality of first intersections, wherein the second wires are electrically connected to the first wires at the first intersections, wherein the second wires directly connect to a driving unit and transmit signals from the driving unit;
    a plurality of conductive pillars disposed at the first intersections, and between the first wires and the second wires, wherein each of the conductive pillars is electrically connected to a corresponding one of the first wires and a corresponding one of the second wires, wherein an area at which each of the conductive pillars orthogonally projects on the substrate is greater than an area of overlap between the orthogonal projection of the conductive pillar on the substrate and an orthogonal projection of the corresponding first on the substrate; and
    an insulating layer disposed between the first wires and the second wires, and surrounding the conductive pillars.

* * * * *